(12) United States Patent
Usuda

(10) Patent No.: US 7,404,614 B2
(45) Date of Patent: Jul. 29, 2008

(54) DROPLET DISCHARGE DEVICE, METHOD OF DISCHARGING DROPLET, METHOD OF MANUFACTURING ELECTRO-OPTICAL DEVICE, ELECTRO-OPTICAL DEVICE AND ELECTRO EQUIPMENT

(75) Inventor: Hidenori Usuda, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 370 days.

(21) Appl. No.: 11/103,477

(22) Filed: Apr. 12, 2005

(65) Prior Publication Data
US 2005/0243122 A1 Nov. 3, 2005

(30) Foreign Application Priority Data
Apr. 30, 2004 (JP) .............................. 2004-135939

(51) Int. Cl.
B41J 2/165 (2006.01)
B41J 29/393 (2006.01)
(52) U.S. Cl. .............................. 347/23; 347/29; 347/30; 347/32; 347/19
(58) Field of Classification Search .................... 347/19, 347/22–35
See application file for complete search history.

(56) References Cited

U.S. PATENT DOCUMENTS

| | | | | |
|---|---|---|---|---|
| 5,475,404 A | * | 12/1995 | Takahashi et al. ............. | 347/23 |
| 5,896,143 A | * | 4/1999 | Matsui et al. .................. | 347/24 |
| 6,095,632 A | * | 8/2000 | Kobayashi et al. ............ | 347/23 |
| 6,224,188 B1 | * | 5/2001 | Suzuki ......................... | 347/35 |
| 6,719,400 B2 | * | 4/2004 | Inui et al. ..................... | 347/23 |
| 6,764,159 B2 | * | 7/2004 | Endo ............................ | 347/19 |
| 6,880,913 B2 | * | 4/2005 | Suzuki ......................... | 347/23 |
| 7,014,305 B2 | * | 3/2006 | Matsumoto et al. ........... | 347/86 |

FOREIGN PATENT DOCUMENTS

| | | |
|---|---|---|
| JP | A-2002-079693 | 3/2002 |
| JP | A 2002-79693 | 3/2002 |
| JP | A-2002-264357 | 9/2002 |
| JP | A-2003-334961 | 11/2003 |
| JP | A-2004-122115 | 4/2004 |
| KR | 2004-12580 | 2/2004 |

* cited by examiner

Primary Examiner—Shih-Wen Hsieh
(74) Attorney, Agent, or Firm—Oliff & Berridge, PLC

(57) ABSTRACT

Aspects of the invention provide a droplet discharge device, a method of discharging a droplet, a method of manufacturing an electro-optical device, and electronic equipment that can grossly reduce a disposed liquid and effectively utilize more discharging liquid as compared with a related art manner in which a nozzle clogging of a head is recovered by a cleaning suction. The droplet discharge device that discharges a droplet to a workpiece can include a head that has a plurality of nozzles, a suction device for sealing and suctioning a nozzle surface of the head, and a controller by which the nozzle surface is sealed by the suction device and the droplet is discharged to the suction device from the nozzle, and the nozzle surface is kept moist by leaving the nozzle surface sealed by the suction device, if the number of clogged nozzle exceeds a predetermined number.

8 Claims, 13 Drawing Sheets

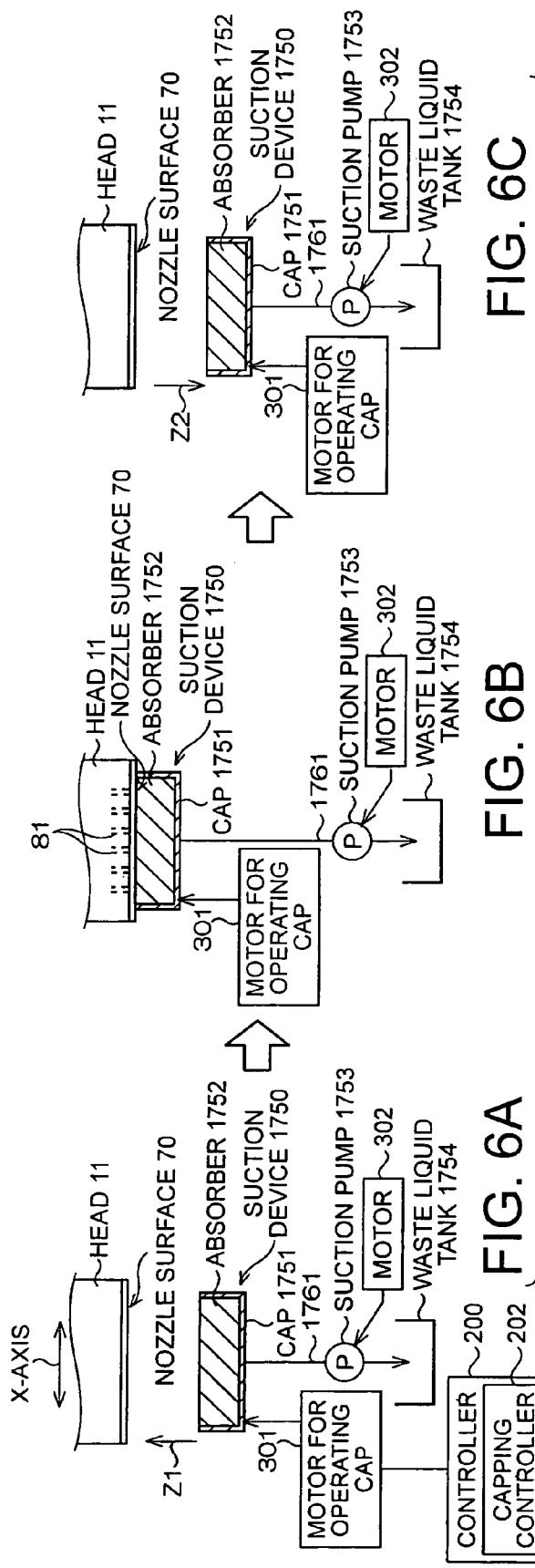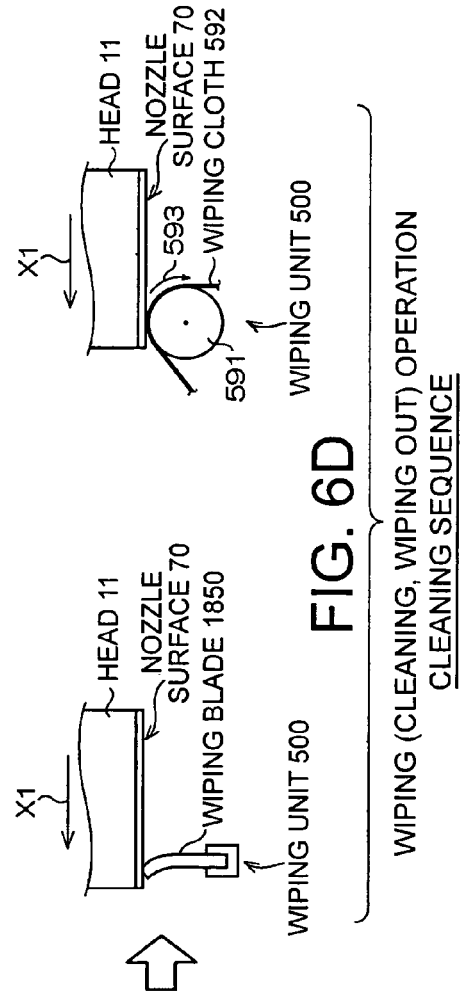

CAP-LEFT-STANDING CONDITION AFTER FLUSING

INFORMATION STORAGE PART 1810

| | CAPPING TIME (TC): MONTH (M) | RATIO "N" OF INCOMPLETE DOT (%) | PERFORM CLEANING SEQUENCE | THE NUMBER OF FLUSHINGS | CAPPING TIME |
|---|---|---|---|---|---|
| MODE 1 | 0≤TC<1M | | | | |
| | | N≤5% | ○ | | |
| | | 5%<N | ○ | 100 SEGMENTS | 6 HOURS |
| MODE 2 | 1M≤TC<4M | N≤5% | ○ | | |
| | | 5%<N≤10% | | 200 SEGMENTS | 12 HOURS |
| MODE 3 | 4M≤TC | 10%<N | | 400 SEGMENTS | 24 HOURS |
| | | ↑ TABLE A | | ↑ TABLE B | |

FIG. 10

DROPLET DISCHARGE DEVICE, METHOD OF DISCHARGING DROPLET, METHOD OF MANUFACTURING ELECTRO-OPTICAL DEVICE, ELECTRO-OPTICAL DEVICE AND ELECTRO EQUIPMENT

BACKGROUND

Aspects of the invention can relate to a droplet discharge device for discharging droplets to a workpiece, a method of discharging a droplet, a method of manufacturing an electro-optical device, an electro-optical device, and electronic equipment.

A droplet discharge device can often be used in a drawing system. The drawing system discharges droplets to a workpiece by an ink jet method. The drawing system can sometimes used for manufacturing an electro-optical device, such as a flat panel display.

A related art droplet discharge device that discharges minute droplets by an ink jet system has a head for discharging droplets. The head is required to discharge minute droplets to a workpiece stably and accurately. Thus, a phenomenon in which a plurality of nozzles in a head is clogged is prevented for ensuring the stable and accurate discharge of minute droplets. There has been proposed a technique (for example, refer to Japanese Unexamined Patent Publication No. 2002-79693 (page 10, FIG. 9), in which droplets are discharged from nozzles, if necessary, using suction to clean the nozzle surface of a head for preventing nozzle clogging.

SUMMARY

This sort of method of cleaning a head needs to reduce the number of cleanings in order to reduce an amount of consumed ink as a discharging liquid due to increase of the number of cleanings. Therefore, detecting an inactive discharge nozzle (referred to as an unworking nozzle or an undischarging nozzle) can be performed before cleaning a head so as to perform a cleaning only when the inactive nozzle is present. In the cleaning operation, a plurality of nozzle sets is subjected as a unit. However, since the cleaning is eventually performed as a recovery treatment of a nozzle of a head, a problem arises in which the amount of consumed ink is increased, and disposed ink amount cannot be reduced.

A case is disclosed in which cleaning is performed at a fixed time interval according to a timer provided upon cleaning. Also, this describes that detecting inactive discharge nozzle (incomplete dot) is performed before so-called a timer cleaning, so that the timer cleaning operation is omitted. However, the timer cleaning is also performed if an incomplete nozzle occurs, resulting to no reduction of the amount of consumed ink.

Aspects of the invention aims to provide a droplet discharge device, a method of discharging a droplet, a method of manufacturing an electro-optical device, an electro-optical device, and electronic equipment that can grossly reduce a disposed liquid and effectively utilize more discharging liquid as compared with a conventional manner in which a nozzle clogging of a head is recovered by a cleaning suction.

The aim is achieved by a droplet discharge device that discharges a droplet to a workpiece according to a first aspect of the invention. The droplet discharge device can include a head having a plurality of nozzles that discharge a droplet of a supplied liquid, a suction device for sealing and suctioning a surface of at least one of the plurality of nozzles, and a controller. The controller lets the suction device seal the surface of the nozzle and the head discharge the droplet from the nozzle to the suction device, and let the suction means keep the surface of the nozzle moist by leaving the surface of the nozzle sealed, if the number of nozzles that are clogged exceeds a predetermined number.

According to the construction of the first aspect of the invention, the head can include the plurality of nozzles that discharge the droplet of the supplied liquid. The suction means seals and suctions the surface of the nozzle of the head.

The controller lets the suction device seal the surface of the nozzle and the head discharge the droplet from the nozzle to the suction device, and the suction device keep the surface of the nozzle moist by leaving the surface of the nozzle sealed, if the number of clogged nozzles exceeds the predetermined number.

Accordingly, before the droplet discharge device discharges a droplet, if the number of clogged nozzles exceeds the predetermined number, the controller lets the suction device seal the surface of the nozzle and the head discharge the droplet from the nozzle to the suction device. Then, the suction device keep the surface of the nozzle moist by leaving the surface of the nozzle sealed. In this way, using the suction device, the surface of the nozzle is kept moist by leaving the surface of the nozzle sealed by the suction device. As a result, a nozzle clogging of the head can reliably be recovered.

Therefore, disposed liquid can grossly be reduced as compared with a related art method in which a nozzle clogging of the head is recovered by suctions of cleaning operation, whereby a discharged droplet can effectively be utilized. That is, a phenomenon can be avoided in which the cleaning operation is repeated many times in order to recover the clogged nozzle. As a result, an amount of liquid to be used can be reduced.

In the construction of the first aspect of the invention, if the number of clogged nozzles is the predetermined number or below, the controller may let the suction device perform a suction operation in which the surface of the nozzle of the head is sealed and suctioned. In the construction, if the number of clogged nozzle is the predetermined number or below, the controller may let the suction means perform the suction operation in which the surface of the nozzle is sealed and suctioned. In this way, if the number of clogged nozzle is the predetermined number or below, a nozzle clogging of the head is recovered by the suction operation while the surface of the nozzle of the head being sealed by the suction device. Consequently, if the number of clogged nozzle is the predetermined number or below, a nozzle clogging is recovered by the suction operation.

In the construction of the first aspect of the invention, selecting means may be included in which the suction operation or an operation in which the surface of the nozzle is kept moist by leaving the surface of the nozzle sealed. According to the construction, the selecting device can select the suction operation or the operation in which the surface of the nozzle is kept moist by leaving the surface of the nozzle sealed. Consequently, a user can accordingly select the suction operation in which the suction is performed by the suction means, or the operation in which the surface of the nozzle is kept moist by leaving the surface of the nozzle sealed, using the selecting device.

In the construction of the first aspect of the invention, left-standing-time device for reporting time in which the surface of nozzle is kept moist by leaving the surface of the nozzle sealed, may be included. In the construction, for users, the left-standing-time reporting means can report the time in which the surface of nozzle is kept moist by leaving the surface of the nozzle sealed. In the construction of the first aspect of the invention, an inactive discharge nozzle detection part may be included by which the nozzle that is clogged is detected and reported to the controller. According to the construction, the inactive discharge nozzle detection part can detect the existence or nonexistence of a clogged nozzle. Consequently, the number of clogged nozzles detected by the inactive discharge nozzle detection part can surely be reported to the controller.

The aforementioned aim is achieved by a method of discharging a droplet in which the droplet is discharged to a workpiece according to a second aspect of the invention. The method can include a step of sealing a surface of a nozzle by suction device for sealing and suctioning the surface of the nozzle, a step of discharging the droplet to the suction device from the nozzle, and a step of keeping the surface of the nozzle moist by leaving the surface of the nozzle sealed by the suction device, if the nozzle of the head is clogged and the number of the nozzles that are clogged is more than a predetermined number.

Accordingly, before the droplet discharge device discharges a droplet, if the number of clogged nozzles exceeds the predetermined number, the controller lets the suction device seal the surface of the nozzle and the head discharge the droplet from the nozzle to the suction device. Then, the suction device keep the surface of the nozzle moist by leaving the surface of the nozzle sealed. In this way, using the suction device, the surface of the nozzle is kept moist by leaving the surface of the nozzle sealed by the suction device. As a result, a nozzle clogging of the head can reliably be recovered.

Therefore, disposed liquid can grossly be reduced as compared with a conventional method in which a nozzle clogging of the head is recovered by suctions of a cleaning operation, whereby a discharged droplet can effectively be utilized. That is, a phenomenon can be avoided in which the cleaning operation is repeated many times in order to recover the clogged nozzle. As a result, an amount of liquid to be used can be reduced.

The aforementioned aim is achieved by a method of manufacturing an electro-optical device using a droplet discharge device that discharges the droplet to a workpiece according to a third aspect of the invention. The method can include a step of sealing a surface of a nozzle by suction device for sealing and suctioning the surface of the nozzle, a step of discharging the droplet to the suction means from the nozzle, and a step of keeping the surface of the nozzle moist by leaving the surface of the nozzle sealed by the suction means, if the nozzle of the head is clogged and the number of the nozzles that are clogged is more than a predetermined number, and subsequently, a step of discharging the droplet to the workpiece.

Accordingly, before the droplet discharge device discharges a droplet, if the number of clogged nozzles exceeds the predetermined number, the controller lets the suction device seal the surface of the nozzle and the head discharge the droplet from the nozzle to the suction device. Then, the suction means keep the surface of the nozzle moist by leaving the surface of the nozzle sealed. In this way, using the suction device, the surface of the nozzle is kept moist by leaving the surface of the nozzle sealed by the suction device. As a result, a nozzle clogging of the head can reliably be recovered.

Therefore, disposed liquid can grossly be reduced as compared with a related art method in which a nozzle clogging of the head is recovered by suctions of a cleaning operation, whereby a discharged droplet can effectively be utilized. That is, a phenomenon can be avoided in which the cleaning operation is repeated many times in order to recover the clogged nozzle. As a result, an amount of liquid to be used can be reduced.

In a case where an electro-optical device is manufactured using a droplet discharge device, discharging liquid can be used more for manufacturing the electro-optical device, thereby enabling a cost down to be achieved in manufacturing electro-optical devices. Also, the nozzle can be prevented from a clogging, and inactive nozzle can surely be prevented from being taken place, whereby quality of electro-optical devices in manufacturing can be improved.

The aforementioned aim can be achieved by an electro-optical device using a droplet discharge device that discharges the droplet to a workpiece according to a fourth aspect of the invention. The electro-optical device is manufactured by a method that includes a step of sealing a surface of a nozzle by suction device for sealing and suctioning the surface of the nozzle, a step of discharging the droplet to the suction device from the nozzle, and keeping the surface of the nozzle moist by leaving the surface of the nozzle sealed by the suction device, if the nozzle of the head is clogged and the number of the nozzles that are clogged is more than a predetermined number, and subsequently, a step of discharging the droplet to the workpiece.

Accordingly, before the droplet discharge device discharges a droplet, if the number of clogged nozzles exceeds the predetermined number, the controller lets the suction device seal the surface of the nozzle and the head discharge the droplet from the nozzle to the suction device. Then, the suction device keep the surface of the nozzle by leaving the surface of the nozzle sealed. In this way, using the suction device, the surface of the nozzle is kept moist by leaving the surface of the nozzle sealed by the suction device. As a result, a nozzle clogging of the head can reliably be recovered.

Therefore, disposed liquid can grossly be reduced as compared with a related art method in which a nozzle clogging of the head is recovered by suctions of a cleaning operation, whereby a discharged droplet can effectively be utilized. That is, a phenomenon can be avoided in which the cleaning operation is repeated many times in order to recover the clogged nozzle. As a result, an amount of liquid to be used can be reduced.

Therefore, in a case where an electro-optical device is manufactured using a droplet discharge device, discharging liquid can be used more for manufacturing the electro-optical device, thereby enabling a cost down to be achieved in manufacturing electro-optical devices. Also, the nozzle can surely be prevented from a clogging, and inactive nozzle can surely be prevented from being taken place, whereby quality of electro-optical devices in manufacturing can be improved.

Electronic equipment according to a fifth aspect of the invention includes the electro-optical device according to the fourth aspect of the invention.

BRIEF DESCRIPTION OF THE DRAWINGS

The invention will be described with reference to the accompanying drawings, wherein like numerals reference like elements, and wherein:

FIG. 6 is a diagram illustrating suction device for performing a cleaning sequence and an example of a wiping unit;

FIG. 10 is a table illustrating examples of a cleaning sequence, the number of flushings in a cap, and a capping-time that are stored in an information storage part;

DETAILED DESCRIPTION OF EMBODIMENTS

Exemplary embodiments of the invention will be described below with reference to the accompanying drawings.

Figure 1:
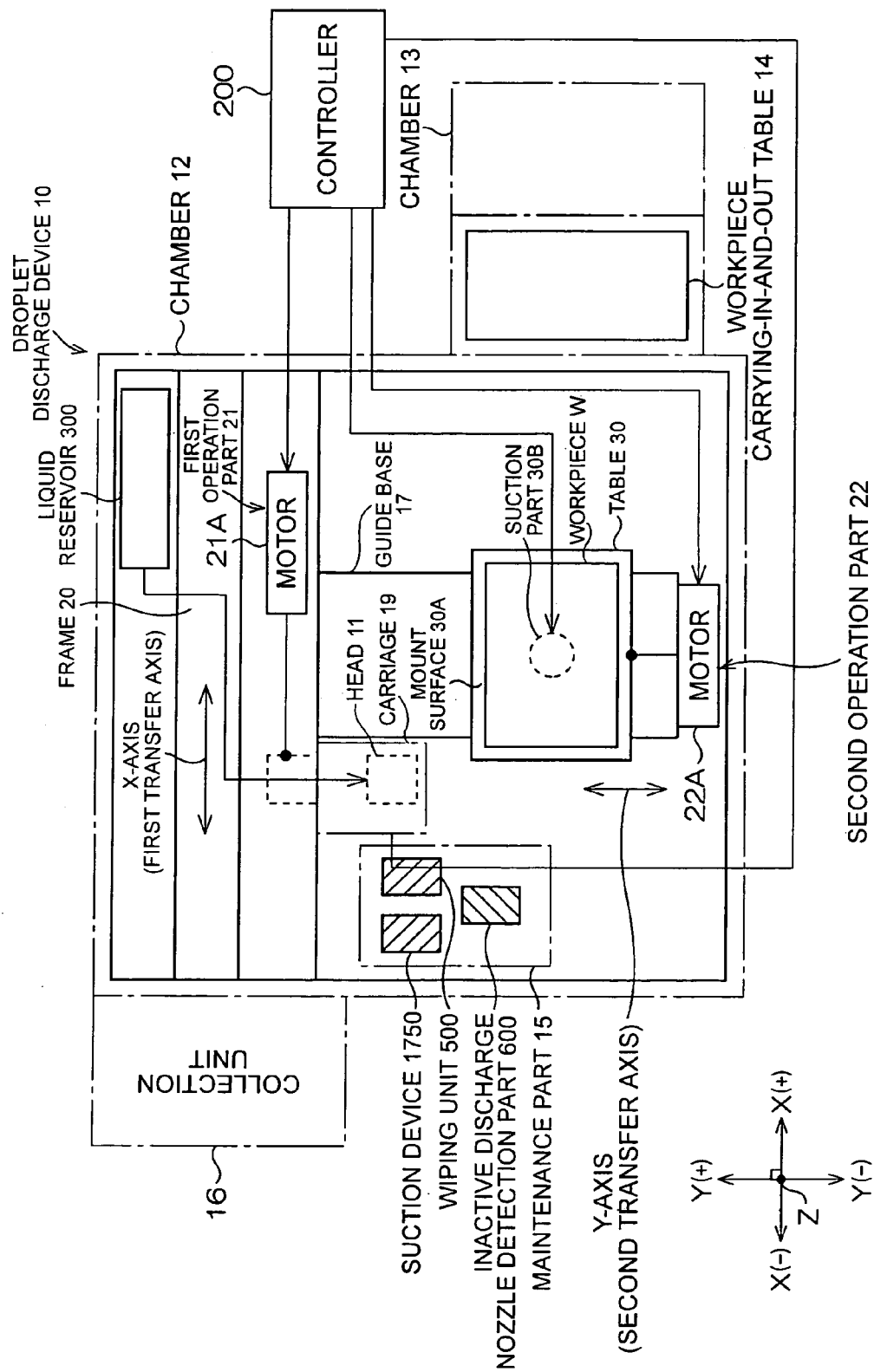
FIG. 1 is a plan view illustrating a droplet discharge device according to an exemplary embodiment of the invention.

FIG. 1 is a plan view illustrating an exemplary embodiment of a droplet discharge device of the invention. A droplet discharge device 10 can be used, for example, as a drawing system. The droplet discharge device is incorporated into a manufacturing line of, for example, an organic electroluminescence (EL) device that is a type of so-called flat panel displays. The droplet discharge device 10 can form a luminescent element that serves as each pixel of an organic EL device.

The droplet discharge device 10 can be used as, for example, an inkjet-type drawing system. The droplet discharge device 10 is purposed for forming, for example, luminescent elements of organic EL devices by a droplet discharge method (inkjet method). A head (is also referred to as a functional droplet discharge head) of the droplet discharge device 10 can form luminescent elements of organic EL devices. Specifically, in manufacturing processes of organic EL elements, a head into which a luminescent functional material is introduced is relatively scanned with respect to a substrate (an example of workpieces) on which a bank is formed through a bank forming process and a plasma treatment process. As a result, the droplet discharge device 10 can form a layered part of a hole injection/transport layer and a luminescent layer corresponding to a position of a pixel electrode.

For example, two droplet discharge devices 10 are prepared. One droplet discharge device 10 can form a hole injection/transport layer and the other droplet discharge device 10 can form luminescent layers of three colors: R (red), G (green), and B (blue).

The droplet discharge device 10 in FIG. 1 is housed in a chamber 12. The chamber 12 has a chamber 13. A workpiece carrying-in-and-out table 14 is housed in the chamber 13. The workpiece carrying-in-and-out table 14 is the table for the purpose of carrying a workpiece W into the chamber 12 or carrying out the processed workpiece W from a table 30 in the chamber 12.

A maintenance part 15 that maintenances a head 11 is housed in the chamber 12 shown in FIG. 1. At an external of the chamber 12, a collection unit 16 is installed.

The maintenance part 15 can include a suction device 1750, a wiping unit 500, an inactive discharge nozzle detection part 600 or a weight measuring unit (not shown), etc.

The suction device 1750 is purposed for suctioning droplets and air bubbles from a nozzle surface of the head 11. A wiping blade of the wiping unit 500 is purposed for wiping dirt adhering to a nozzle surface. The inactive discharge nozzle detection part 600 inspects a discharge condition of droplets discharged from the head 11. The weight measuring unit measures a weight of droplets discharged from the head 11.

The collection unit 16 has, for example, a droplet collection system for collecting droplets and a cleaning liquid supply system for supplying a cleaning solvent used after wiping.

Air in the chamber 12 and air atmosphere in the chamber 13 are individually controlled so that no fluctuations occur in the air atmosphere of the chambers 12 and 13. The chambers 12 and 13 are used in order to be able to eliminate influences of atmospheric air from the reason in which moisture, etc., in atmospheric air is avoided, for example, when an organic EL element is manufactured. Dry air is continuously introduced into and exhausted from the chambers 12 and 13 to maintain a dry air atmosphere.

Next, components in the chamber 12 shown in FIG. 1 will now be described.

A frame 20, the head 11, a carriage 19, a liquid reservoir 300, a first operation part 21, a second operation part 22, the table 30, and a guide base 17 are housed in the chamber 12.

The frame 20 in FIG. 1 is disposed in a horizontal position along the X-axis direction. The guide base 17 is disposed along the Y-axis direction. The frame 20 is above the guide base 17. The X-axis corresponds to a first transfer axis. The Y-axis corresponds to a second transfer axis. The X-axis and Y-axis are orthogonal each other and both are orthogonal to the Z-axis. The Z-axis is perpendicular to the drawing in FIG. 1.

The first operation part 21 is purposed for linear reciprocal travel and positioning the carriage 19 and the head 11 along the frame 20 as well as the X-axis direction.

The second operation part 22 includes the table 30. The table 30 may mount the workpiece W such as shown in FIG. 1 so as to be detachable. The table 30 in the second operation part 22 holds the workpiece W, when droplets are applied to the workpiece W from the head 11. The second operation part 22 can linearly move the workpiece W on the guide base 17 along the Y-axis direction to be positioned.

The first operation part 21 includes a motor 21A for linearly moving and positioning the head 11 along the X-axis direction. The motor 21A can linearly move the head 11 in the X-axis direction, for example, using a feed screw. The motor 21A may be such rotary electric motor or a linear motor.

A motor 22A in the second operation part 22 can linearly move the table 30 along the guide base 17 in the Y-axis direction to be positioned. For the motor 22A, for example, a rotary electric motor that rotates a feed screw can be used. A linear motor also can be used for the motor 22A in addition to the rotary electric motor.

The second operation part 22 can include a mount surface 30A. The mount surface 30A is the surface perpendicular to the Z-axis direction in FIG. 1. The mount surface 30A includes a suction part 30B. The suction part 30B can suction and hold the workpiece W by vacuum suction. This allows the workpiece W to be reliably fixed to the mount surface 30A without sifting and so as to be detachable.

Figure 2:
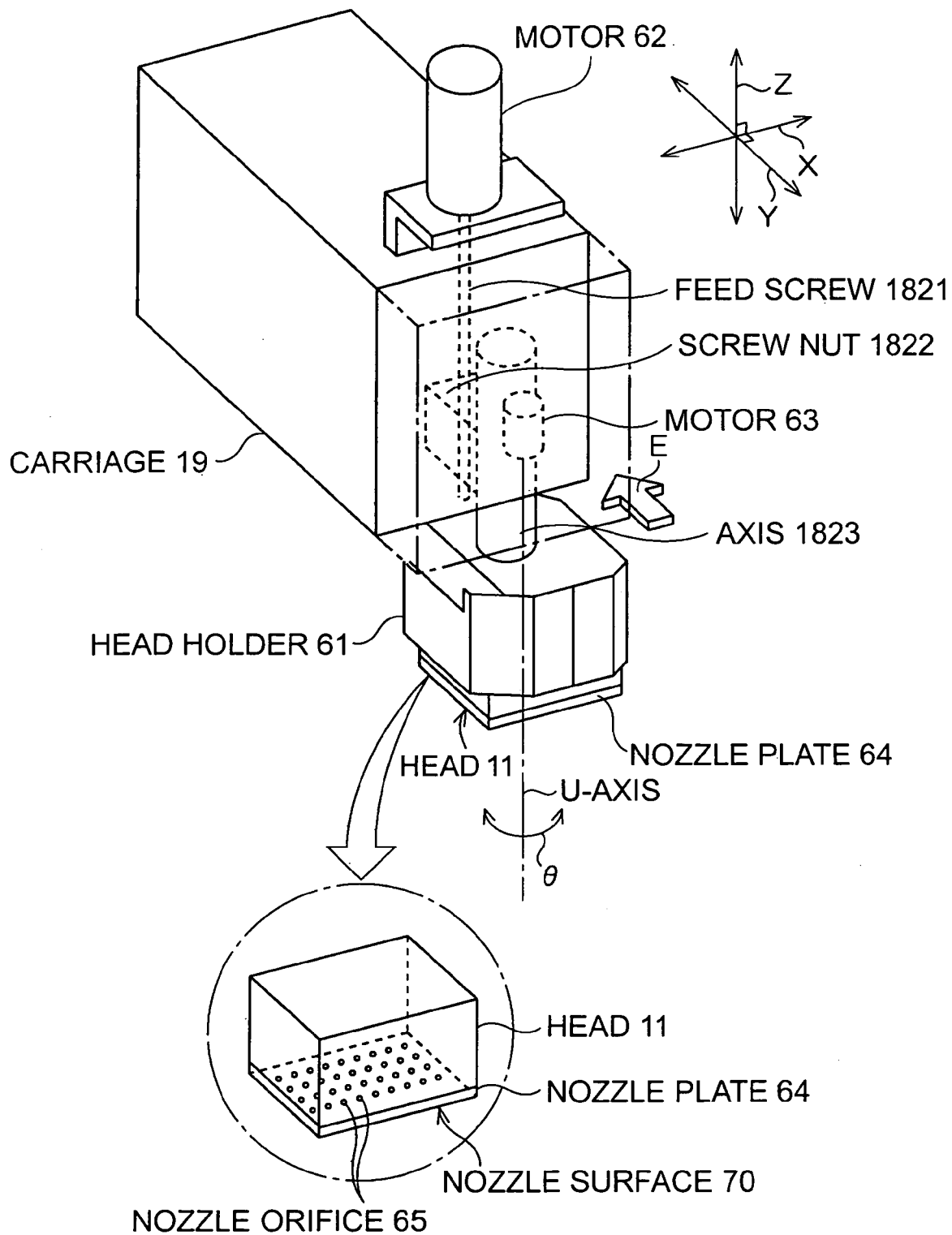
FIG. 2 is a perspective view illustrating a carriage, a head, etc., of the droplet discharge device of FIG. 1.
Figure 3:
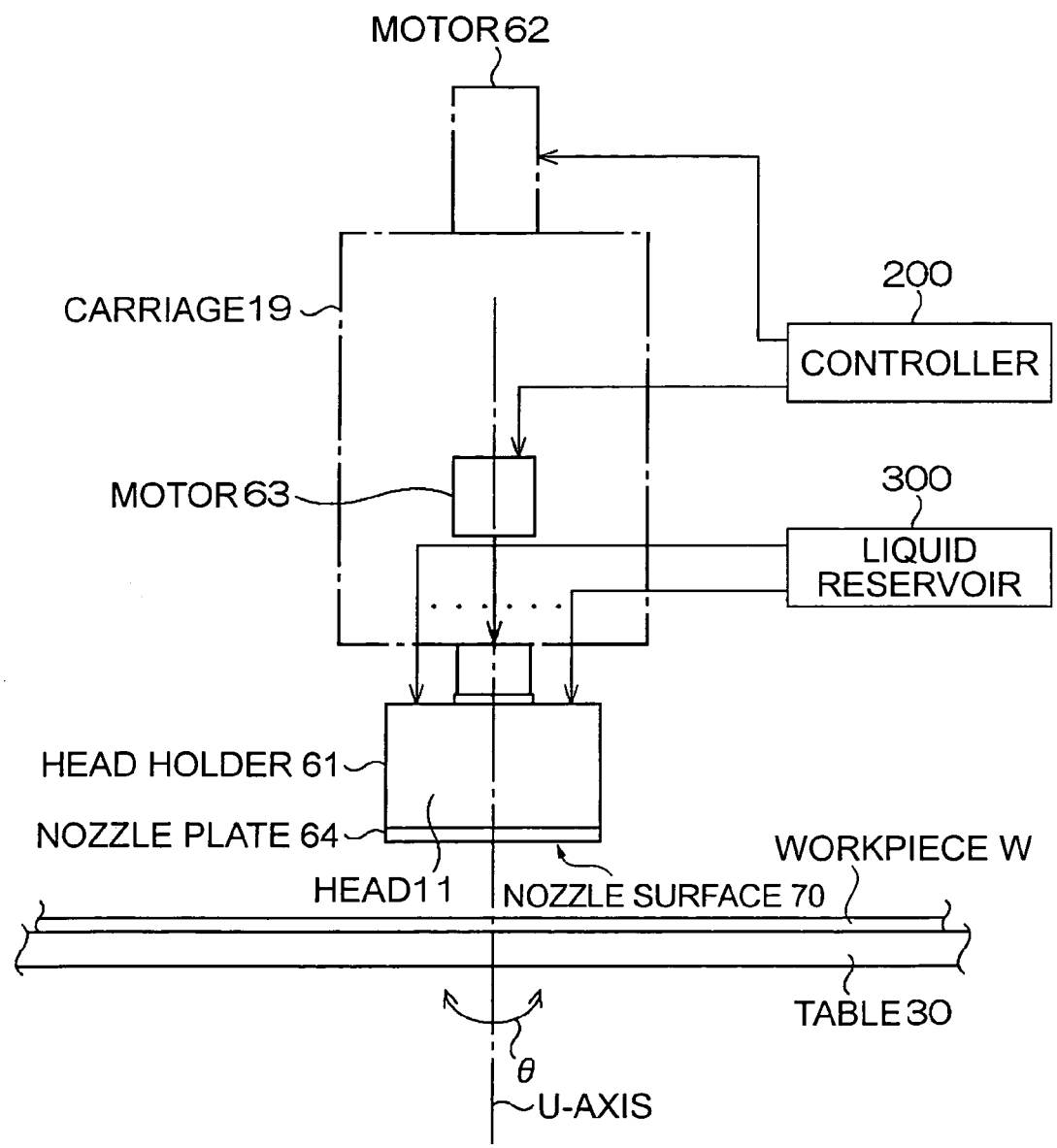
FIG. 3 is a front view seen from E direction in FIG. 2 illustrating the carriage, head; etc.

Next, a structural example of the carriage 19 and the head 11 will be described with reference to FIGS. 2 and 3. FIG. 2 is a perspective view illustrating a shape example of the carriage 19 and around the head 11. FIG. 3 is an example of front view seen from E direction in FIG. 2.

The carriage 19 can be moved in the X-axis direction and positioned by the motor 21A shown in FIG. 1. The carriage 19 holds the head 11 using a head holder 61 so as to be detachable. The output axis of a motor 62 is connected to a feed screw 1821. The feed screw 1821 is engaged with a screw nut 1822 of an axis 1823.

When the motor 62 shown in FIG. 2 runs, the feed screw 1821 rotates to allow a unit of the screw nut 1822, the axis 1823, the head holder 61, and the head 11 to move upward and downward along the Z-axis direction to be positioned. By operating another motor 63, the head 11 can be rotated in θ direction with the U-axis as a center of rotation.

As shown in FIGS. 2 and 3, the head 11 can include a nozzle plate 64. The undersurface of the nozzle plate 64 is a nozzle surface 70. The nozzle surface 70 includes a nozzle orifice 65 of a plurality of nozzles. The head 11 is coupled to a liquid reservoir 300 with a tube. The liquid reservoir 300 is referred to as a functional liquid reservoir. A liquid is an example of a functional liquid used for forming a layered part of hole injection/transport layer and luminescent layer of an organic EL element. A liquid in the liquid reservoir 300 can be discharged from the nozzle orifice 65, for example, by inkjet method with operation of a piezoelectric vibrator. As shown in FIG. 3, operations of the motors 62 and 63 are controlled by a controller 200.

Figure 4:
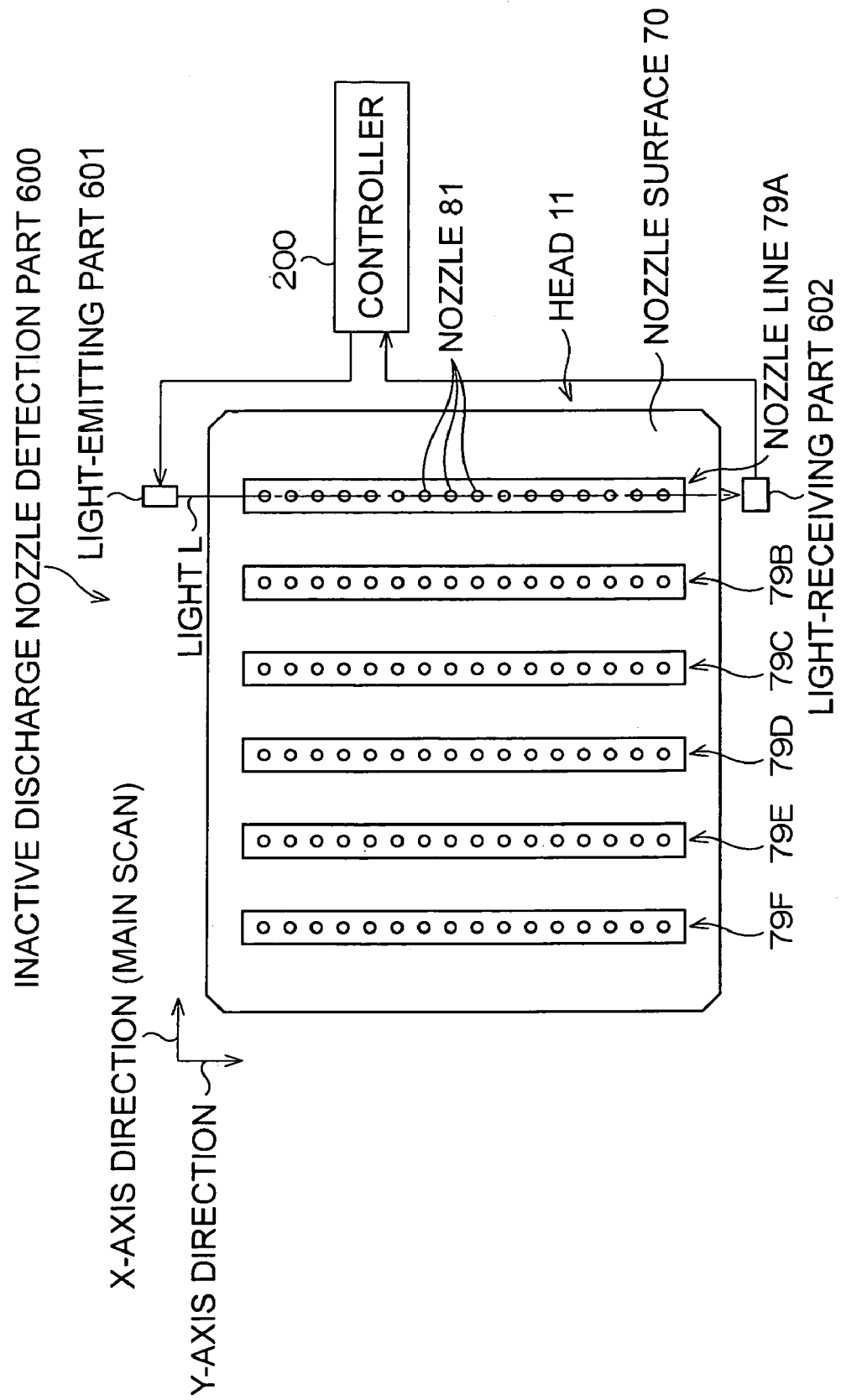
FIG. 4 is a diagram illustrating a shape example of a nozzle surface of a head, and structural example of an inactive discharge nozzle detection part.

FIG. 4 illustrates a shape example of the nozzle surface 70 of the head 11 shown in FIGS. 2 and 3. The nozzle surface 70 includes a plurality of nozzle lines 79A through 79F. Each of nozzle lines 79A through 79F is formed in parallel with the Y-axis direction. Each of nozzle lines 79A through 79F includes a plurality of nozzles 81. In addition, the nozzle lines 79A through 79F are disposed at a predetermined interval in the X-axis direction.

Each of nozzle lines 79A through 79F includes the plurality of nozzles 81. In the example of FIG. 4, six nozzle lines are illustrated. However, the number of nozzle lines is not limited to this, of course, nozzle lines of the number of two or more can be eligible.

As shown in FIG. 4, an inactive discharge nozzle detection part 600 is provided for detecting an inactive discharge nozzle that is clogged in the nozzles 81. The inactive discharge nozzle detection part 600 can be referred to as an unworking nozzle detection part or an undischarging nozzle detection part.

The inactive discharge nozzle detection part 600 can include a light-emitting part 601 and a light-receiving part 602. For example, a laser light-emitting part can be employed as the light-emitting part 601. Light L generated from the light-emitting part 601 is received at the light-receiving part 602. Droplets discharged from the nozzle 81 block an optical path of the light L. In this case, receiving of the light L is temporarily interrupted at the light-receiving part 602. Therefore, if certain nozzle 81 discharges droplets normally, the light L is temporarily interrupted at the light-receiving part 602, whereby the controller 200 can determine that the nozzle is not clogged.

In contrast, if the light L is not shaded at all, the controller 200 can determine that the nozzle 81 is clogged. Meanwhile, there is a case in which whether the light L is interrupted or not is not detected surely enough with only a droplet. Thus, a few drops of droplet are preferably discharged from the nozzle 81.

Upon completion of clogging inspection of each nozzle 81 of the nozzle line 79A in FIG. 4, the head 11 moves bit in the X-axis direction, thereby enabling an inactive nozzle in the nozzles 81 of the next nozzle line 79B to be inspected.

In this way, the inactive discharge nozzle detection part 600 can inspect whether each nozzle 81 of each of nozzle lines 79A through 79F is clogged or not (namely, existence or nonexistence of incomplete dot) by detecting a droplet in flying.

The nozzle lines 79A through 79F shown in FIG. 4 can have structures in each of which a different kind of droplets from each other is discharged, or a construction in which the same kind of droplets is discharged from two or more nozzles adjacent each other.

Next, referring to FIG. 5, electrical connection examples of each component of the droplet discharge device according to the exemplary embodiment of the invention will be described.

Figure 5:
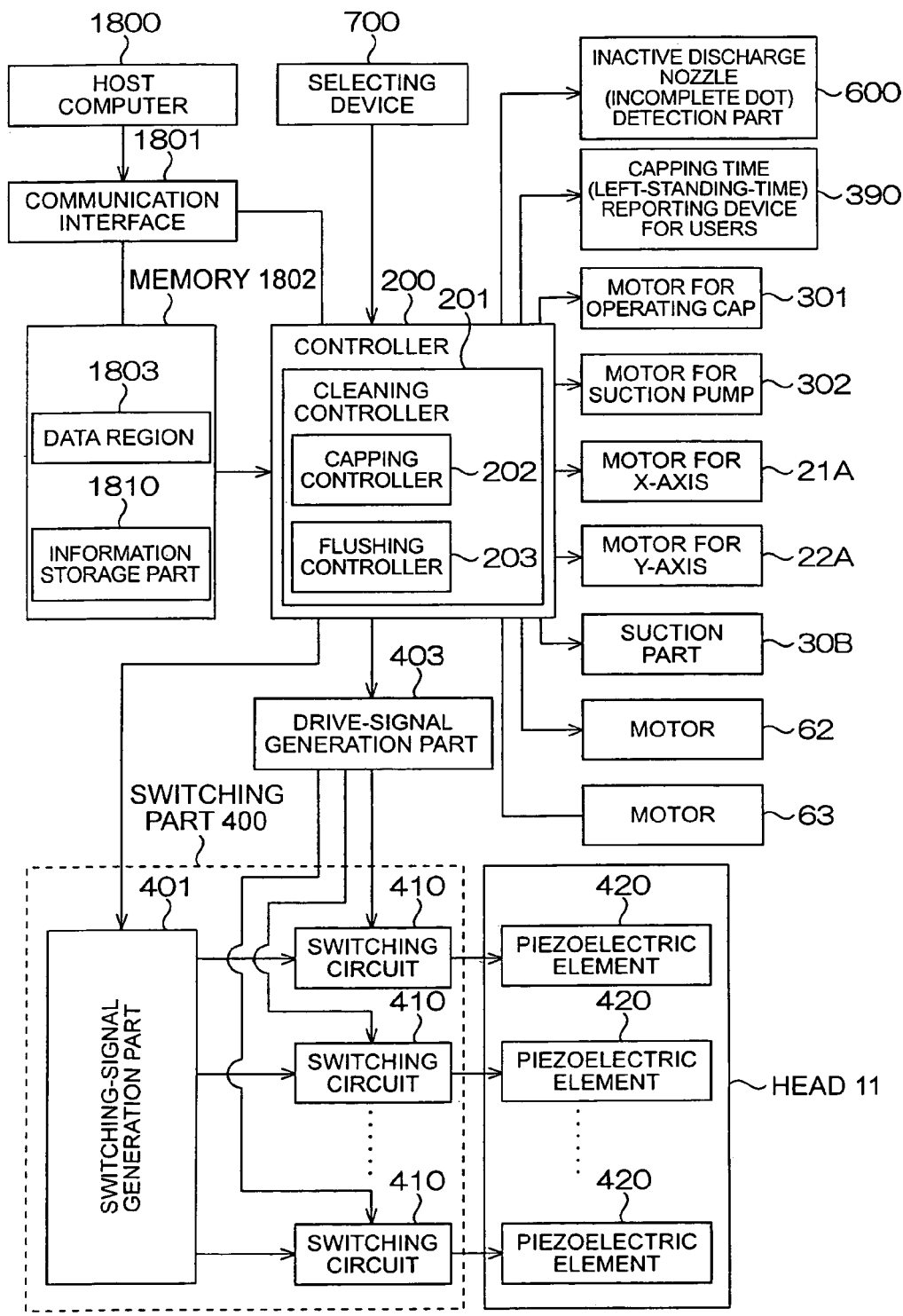
FIG. 5 is a diagram illustrating a controller and an electrical connection example of elements in the vicinity of the controller.

The controller 200 shown in FIG. 5 is coupled to a host computer 1800 with a communication interface 1801. The communication interface 1801 is connected to a memory 1802. The memory 1802 can include a data region 1803 and an information storage part 1810.

The controller 200 can include a cleaning controller 201. The cleaning controller 201 includes a capping controller 202 and a flushing controller 203.

The controller 200 is electrically connected to a selecting device 700, the inactive discharge nozzle detection part 600, a left-standing-time reporting means 390, a motor 301 for operating cap, a motor 302 for suction-pump, a motor 21A for X-axis, a motor 22A for Y-axis, the suction part 30B, the motor 62, the motor 63, a switching-signal generation part 401 of a switching part 400, and a drive-signal generation part 403.

The motors 21A and 22A, the suction part 30B, the motor 62, the motor 63 that are shown in FIG. 5 are illustrated in FIG. 1. The drive-signal generation part 403 shown in FIG. 5 accordingly supplies a signal to a plurality of switching circuits 410 in the switching part 400 by a signal from the controller 200. Each switching circuit 410 is connected to each piezoelectric element (also referred to as piezoelectric vibrator) 420. The switching-signal generation part 401 controls the switching circuit 410 with a signal given from the controller 200, whereby a drive-signal is supplied to the piezoelectric element 420 that needs the signal.

The head 11 can include these piezoelectric elements 420. Each piezoelectric element 420 is provided corresponding to each nozzle 81 of each nozzle line shown in FIG. 4. When the piezoelectric element 420 is driven, droplets can be discharged from the nozzle 81 by an extension and contraction of the piezoelectric element 420.

The motor 301 for operating cap and the motor 302 for suction pump that are shown in FIG. 5 are illustrated in FIG. 6.

FIG. 6 shows a structural example of a suction device 1750. The suction means 1750 can perform a cleaning of nozzles in the head by suctioning the nozzle surface 70 of the head 11 while being sealed. The suction means 1750 includes a cap 1751, an absorber 1752, a suction pump 1753, a waste liquid tank 1754, a motor 301, and a motor 302. The motor 301 is the motor for operating cap in order to move the cap upward in the Z1 direction and downward in the Z2 direction. The motor 302 is the motor for running the suction pump 1753.

The cap 1751 is the member in which the absorber 1752 is housed. A top surface 1760 of the cap 1751 can seal the nozzle surface 70 as shown in FIG. 6B by firmly attaching to the nozzle surface 70.

The absorber 1752, which is housed in the cap 1751, is, for example, a porous material that can absorb droplets. The bottom of the cap 1751 is coupled to the suction pump 1753 with a suction tube 1761.

Accordingly, when the suction pump 1753 runs by running the motor 302, in a sealed condition of FIG. 6B, liquid and air bubbles or cloggings of liquid can be suctioned to the absorber 1752 side from the nozzles 81 of the nozzle surface 70. That is, the suction pump 1753 can clean the nozzles 81 by forcibly suctioning a liquid at the side of the nozzles 81 with a negative-pressure generated inside the cap 1751. The suctioned liquid is exhausted to the waste tank 1754 side through the suction pump 1753.

By running the motor 301 for operating cap, conditions can be changed as shown in FIG. 6A, FIG. 6B, and FIG. 6C. In FIG. 6A, the cap 1751 is in a waiting condition. Next, in FIG. 6B, the cap 1751 is changed in a condition of suctioning. Then, in FIG. 6C, the cap 1751 is in a waiting condition again.

A wiping blade 1850 shown in FIG. 6D is used after using the suction device 1750. The wiping blade 1850 is also referred to as a cleaning member or a wiping member. The wiping blade 1850 is purposed for cleaning the nozzle surface 70 with wiping out droplets on it after suctioning the nozzle surface 70 as shown in FIGS. 6A through 6C. In this case, the nozzle surface 70 can be wiped out with the wiping blade 1850 by traveling the head 11 along the X1 direction in the X-axis direction so as to be relatively even with respect to the wiping blade 1850. The wiping blade 1850 is made of, for example, rubbers or elastomers, etc., that can be elastically deformed.

A sequence for cleaning the nozzle surface 70 is shown in FIGS. 6A through 6D. The capping controller 202 of the cleaning controller 201 in FIG. 5 can control the operation of the motor 301 for operating cap and the motor 302.

Next, FIG. 7 illustrates an example of the left-standing-time reporting device 390 for users shown in FIG. 5.

Figure 7A:
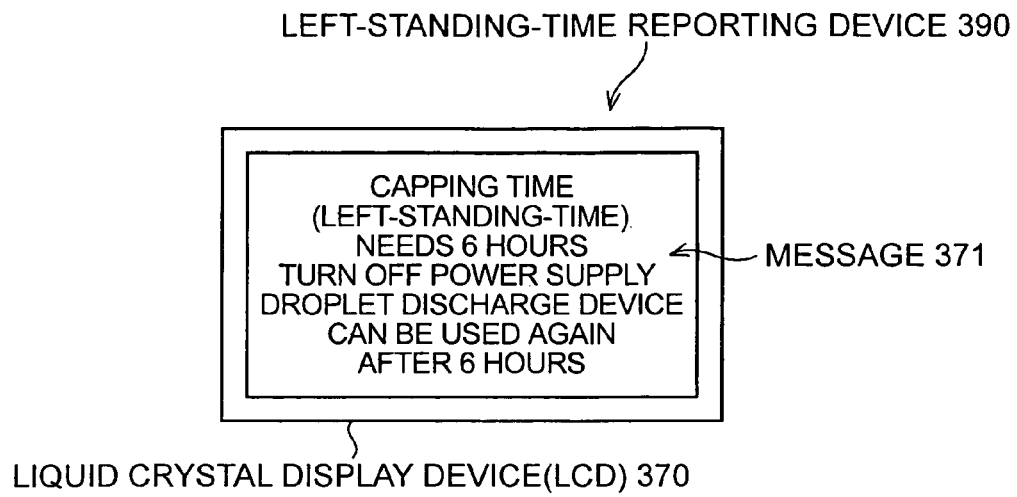
FIG. 7 is a diagram illustrating an example of left-standing-time reporting device for users.
Figure 7B:
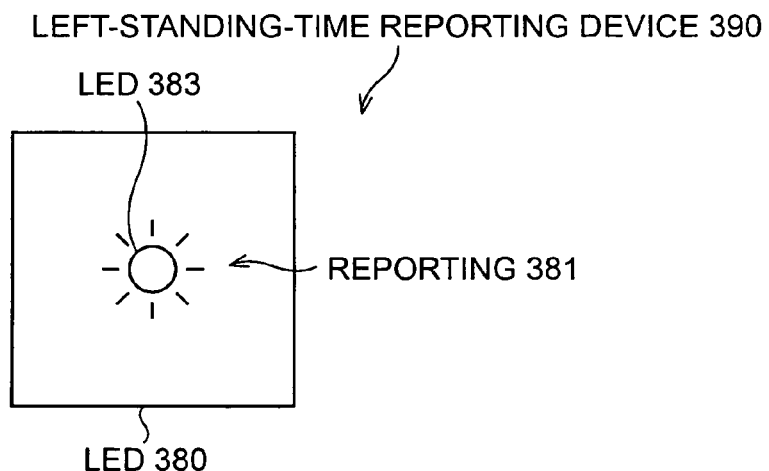

FIG. 7A illustrates an example in which the left-standing-time reporting device 390 for users is a liquid display device (LCD). FIG. 7B illustrates an example in which the left-standing-time reporting means 390 for users is a light-emitting diode (LED).

Figure 8:
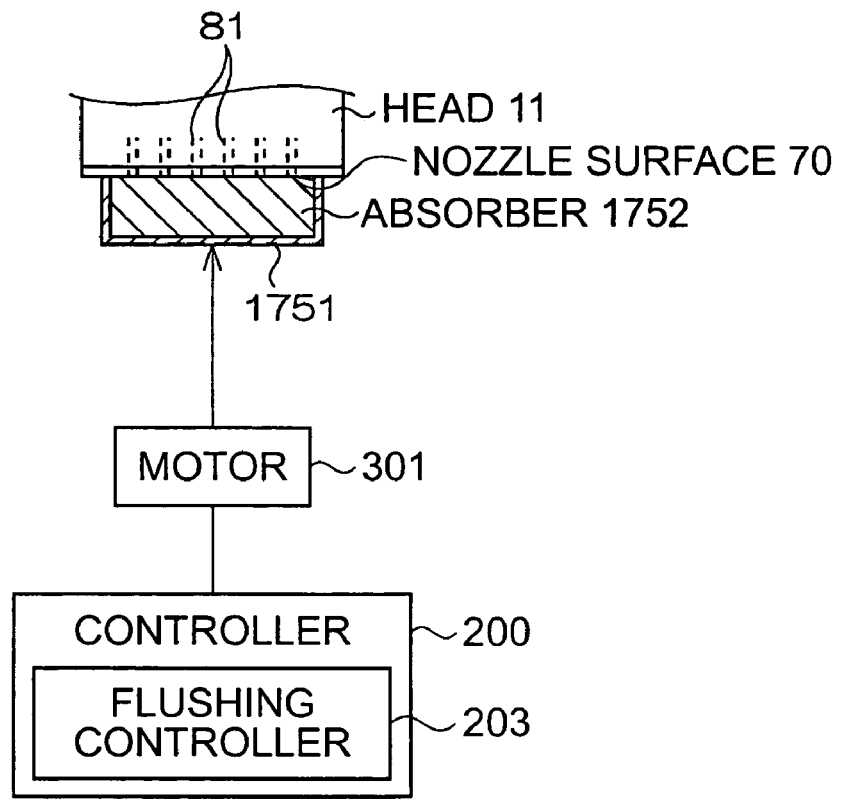
FIG. 8 is a diagram illustrating a condition in which a head is left with capping after performing a flushing.

The left-standing-time reporting means 390 for users is the device for reporting left-standing-time of t condition in which droplets are discharged (flushing) into the cap 1751 and the cap is left as shown in FIG. 8.

First, a cap-left-standing condition as shown in FIG. 8 will now be described. In the condition in which the cap 1751 shown in FIG. 6 is firmly attached to and seals the nozzle surface 70, the cap 1751 seals the nozzles 81 of each nozzle line. While this condition is kept, a liquid flushing (liquid discharge) from each nozzle 81 is performed with each piezoelectric element 420 operated by the flushing controller 203 via the switching part 400 shown in FIG. 5. Accordingly, the liquid is absorbed into the absorber 1752. The liquid absorbed into the absorber 1752 keeps inside the cap 1751 and the nozzle surface 70 moist. This is the condition in which a flushing is performed and the cap is left.

Time of the cap-left-standing condition as mentioned above can be displayed for users by the left-standing-time reporting means 390 for users shown in FIG. 7. In the example of FIG. 7A, a liquid crystal display 370 is used. A message 371 for reporting users is displayed on a screen of the liquid display device 370. The message 371 is exemplified in that "the capping-time (left-standing-time) needs 6 hours. Off the power supply. After 6 hours, the droplet discharge device can be ready for use again."

In contrast, in the example of the left-standing reporting device 390 for users, a LED 380 is used. For the LED 380, for example, a LED for liquid end (indicating that an amount of stored liquid becomes zero) is employed. For a reporting 381 for users, for example, a LED 383 for ink end shown in FIG. 7C can be blinked, for example, six times, and, for example, after two seconds, blinked six times again.

Using the left-standing reporting means 390 for users, the capping-time (left-standing-time) can reliably and visually be reported to users.

Figure 9:
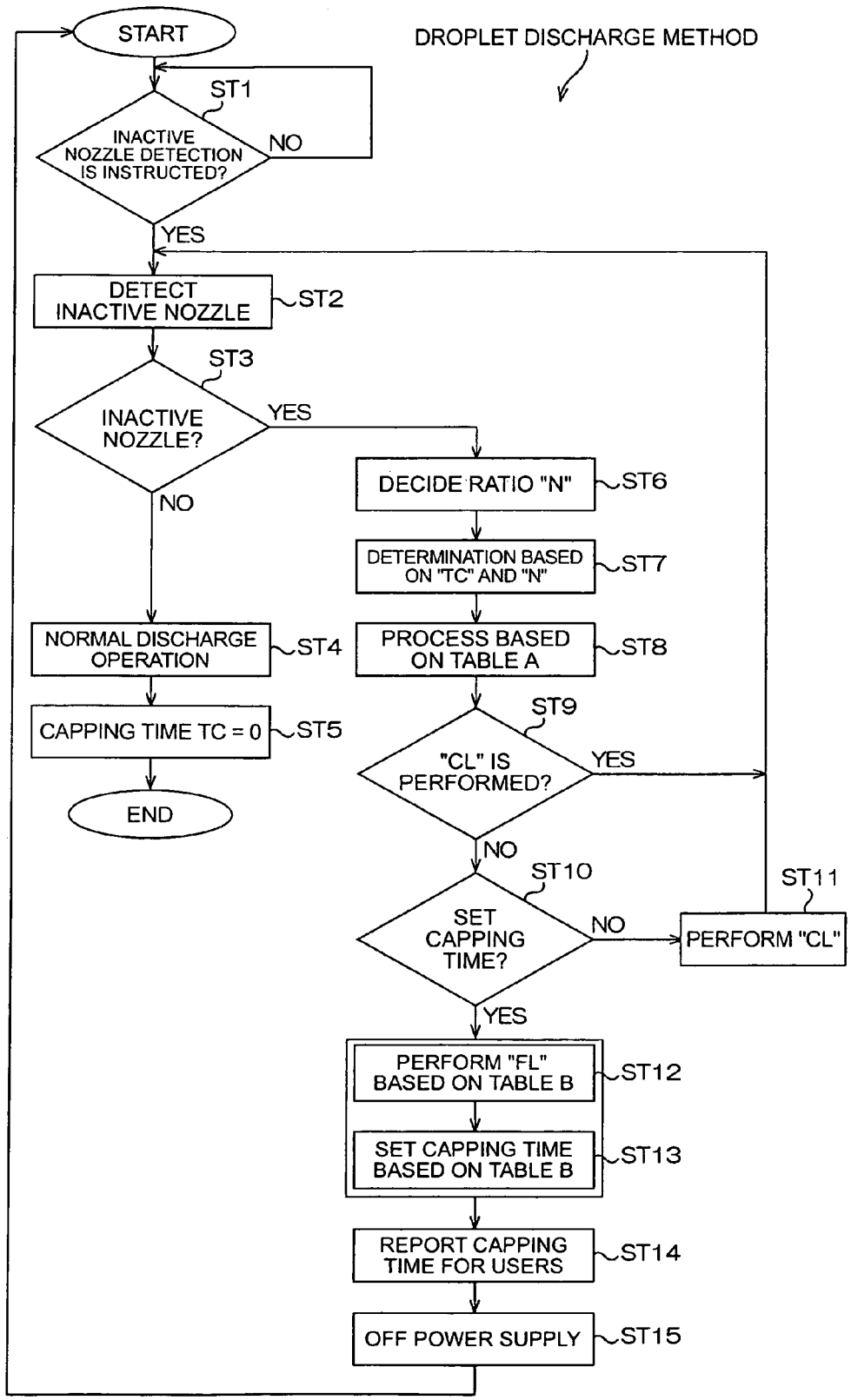
FIG. 9 is a flow chart illustrating a method of discharging a droplet according to another exemplary embodiment of the invention.

FIG. 9 is a flowchart illustrating an example of a method of discharging a droplet that can be conducted by the exemplary embodiment of the droplet discharge device according to the invention.

FIG. 10 illustrates the following examples, when the method of discharging a droplet in FIG. 9 is performed: necessary or unnecessary of performing a cleaning sequence conducted in accordance with a ratio of inactive discharge nozzle of a liquid; the number of flushings (FLs) in the cap; and capping-time (left-standing-time).

The table shown in FIG. 10 includes the table A and the table B. The table A shows that with or without the necessity of performing a cleaning sequence with respect to a ratio N of inactive discharge nozzle of a liquid. The table B shows examples of the number of flushings (droplet discharges) in the cap with respect to a ratio N of inactive discharge nozzle of a liquid, and capping-time.

The tables A and B are stored in the information storage part 1810 of the memory 1802 in FIG. 5. The capping-time (TC) shown in FIG. 10 is classified into three modes: mode 1, mode 2, and mode 3. In the mode 1, the capping-time (TC) passed until just before starting a liquid discharge operation is zero month or more and less than one month. In the mode 2, the capping-time (TC) is one month or more and less than four months. In the mode 3, the capping-time (TC) is four months or more.

In the mode 1, a cleaning sequence is performed without a consideration of the ratio N of inactive discharge nozzle. Also, the number of flushings in the cap and the capping-time (left-standing-time) are not considered.

In the mode 2, two cases are classified. One is the case where the ratio N of inactive discharge nozzle is 5% or below. The other is the case where the N is more than 5%. If the ratio N of inactive discharge nozzle is 5% or below, the cleaning sequence is performed without a consideration of the number of flushings in the cap and the capping-time (left-standing-time).

If the ratio N of inactive discharge nozzle is more than 5%, no cleaning sequence is performed. The number of flushings in the cap is set as 100 segments. The capping-time (left-standing-time) is set as 6 hours.

In the mode 3, if the ratio N of inactive discharge nozzle is 5% or below, the cleaning sequence is performed without a consideration of the number of flushings in the cap and the capping-time (left-standing-time). If the ratio N of inactive discharge nozzle is more than 5% and 10% or below, no cleaning sequence is performed. The number of flushings in the cap is set as 200 segments. The capping-time (left-standing-time) is set as 12 hours. If the ratio N of inactive discharge nozzle is more than 10%, no cleaning sequence is performed. The number of flushings in the cap is set as 400 segments. The capping-time (left-standing-time) is set as 24 hours.

Here, the ratio N of inactive nozzle is defined as the ratio of clogged nozzles to the number of discharge nozzles of one nozzle line. In addition, the segment of the number of flushings represents the total of the number of droplet discharges.

Next, referring to FIG. 9, an embodiment of a method of discharging a droplet will be described.

In the step ST1 of FIG. 9, if an instruction for detecting inactive discharge nozzle is given to the inactive discharge nozzle detection part 600 from the controller 200 in FIG. 5, the step is proceeds to the step ST2. In the step ST2, the inactive nozzle detection part 600 shown in FIGS. 4 and 5 detects inactive discharge nozzles from a plurality of nozzles of a nozzle line.

In the step ST3 in FIG. 9, the controller 200 determines whether or not an inactive discharge nozzle is present. If no inactive discharge nozzle is present, the controller 200 lets the head 11 perform normal discharge operation in the step ST4. In the step ST5, the capping-time TC passed until just before performing a liquid discharge in this case is set to zero. Accordingly, this operation is ended.

In contrast, in the step ST 3, if the inactive discharge nozzle detection part 600 detects an inactive discharge nozzle, the step proceeds to the step ST6.

In the step ST6, the controller 200 in FIG. 5 determines the ratio N of inactive discharge nozzle based on a light-receiving signal from the light-receiving part 602 in FIG. 4.

In the step ST7, the controller 200 determines which one of the modes 1, 2, 3 it is, based on the capping-time TC passed until just before operating a liquid discharge and the ratio N of inactive discharge nozzle.

In the step ST8, a process of the table A shown in FIG. 10 is firstly selected. In the step ST9, the controller 200 determines whether or not the cleaning sequence CL is performed. If the cleaning sequence CL is performed as shown in FIG. 6 in the step ST 9, the step proceeds to the step ST2. Then, the steps ST2 through ST5 are performed and the process ends.

In the cleaning sequence CL, each nozzle 81 of the nozzle surface 70 is sealed by firmly attaching the cap 1751 to the nozzle surface 70 as shown in FIGS. 6A through 6C. While this condition is kept, upon running of the suction pump 1753, a negative pressure is generated in the cap 1751. This allows a liquid and air bubbles to be sent to the waste liquid tank 1754 side from each nozzle 81 through the suction tube 1761 and the suction pump 1753.

Next, as shown in FIG. 6C, the suction pump 1753 stops, so that the cap 1751 moves downwards in the Z2 direction to be in a waiting condition. Then, as shown in FIG. 6D, the wiping blade 1850 wipes out the nozzle surface 70.

In the step ST9 in FIG. 9, the cleaning sequence CL is performed in the following cases: the mode 1 in FIG. 10; and the ratio N of inactive nozzle in the mode 2 and mode 3 is 5% or below.

In the step ST9 of FIG. 9, if no cleaning sequence CL is performed, whether the capping-time (left-standing-time) in the step ST10 is set or not is determined. If not set, the cleaning sequence is performed in the step ST11. Then, the steps ST2 through ST5 are performed and the process ends.

In the step ST10, the controller 200 sets the capping-time (left-standing-time) based on the table B for the following cases: the ratio N of inactive discharge nozzle is more than 5% in the mode2 shown in FIG. 10; the ratio N of inactive discharge nozzle is more than 5% and 10% or below in the mode3; and the N is more than 10% in the mode3.

Accordingly, the controller 200 performs the flushing (liquid discharge) based on the table B in the step ST12, and sets the capping-time (left-standing-time) in the step ST13. For example, in the mode2, if the ratio N of inactive discharge nozzle is more than 5%, the number of flushings in the cap is 100 segments and the capping-time (left-standing-time) is 6 hours. Also, in the mode3, if the ratio N of inactive discharge nozzle is more than 5%, the number of flushings in the cap is 200 segments and the capping-time (left-standing-time) is 12 hours. If the ratio N of inactive discharge nozzle is more than 10%, the number of flushings in the cap is 400 segments and the capping-time (left-standing-time) is 24 hours. In this way, the more increasing the ratio N of inactive discharge nozzle, the more increasing the discharge unit of flushing number in the cap. As a result, the capping-time becomes longer with the increasing.

In the step ST14 in FIG. 9, the capping-time (left-standing-time) is reported to a user. The reporting to a user can be conducted using both or either one of the left-standing reporting means for users shown in FIG. 7A and FIG. 7B. The left-standing-time reporting means 390 for users in FIG. 7A displays the message 371 on the screen of the liquid crystal display device 370. For example, if the capping-time (left-standing-time) is 6 hours, the message can be displayed as shown in FIG. 7A.

Figure 7C:
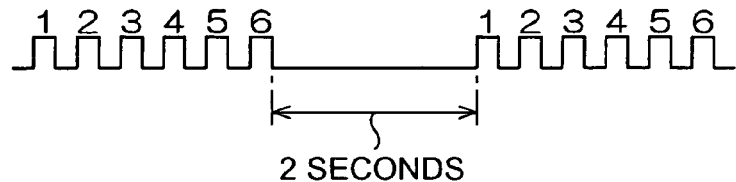

In FIG. 7B, if the capping-time needs 6 hours, the LED 383 blinks 6 times, and after 2 seconds, blinks 6 times again as shown in FIG. 7C. In this way, the reporting 381 of the capping-time (left-standing-time) can be reliably conducted to a user using the left-standing-time reporting means 390 for users of both FIGS. 7A and 7B. For example, after 6 hours, the droplet discharge device can operate discharging a droplet again, namely can be used again.

In FIG. 7B, an interval of each blink on the LED 383 can be set, for example, to 0.5 seconds. In the example of FIG. 7, the capping-time (left-standing-time) ends after 6 hours. Then, a discharge start condition is readied in which droplets can be discharged again.

The display example in FIG. 7 is the case in which the capping-time is 6 hours. However, the left-standing reporting means 390 for users can display, even if the capping-time is 12 hours or 24 hours, using a similar manner.

In FIG. 9, in the step ST15, the power supply of droplet discharge device is off. If needed, by performing the steps ST1 through ST5, a clogging in an inactive discharge nozzle can be recovered with a humectant effect. Subsequently, the head can perform normal discharge operations through the steps ST1 through ST5.

The embodiment of droplet discharge device according to the invention can be used for manufacturing an electro-optical device. Examples of the electro-optical device may include a liquid crystal display, an organic electroluminescence (EL) device, an electron-emitting device, a plasma display panel (PDP) device, and an electrophoresis display device, etc. Here, the concept of electron-emitting device includes a so-called field emission display (FED). Furthermore, as the electro-optical device, various types of devices including metal wiring formation, lens formation, resist formation and light diffusive element formation or the like can be considered. In a case where color filters (CFs) and liquid crystal display devices are manufactured, discharging liquid crystal can be performed.

Figure 11:
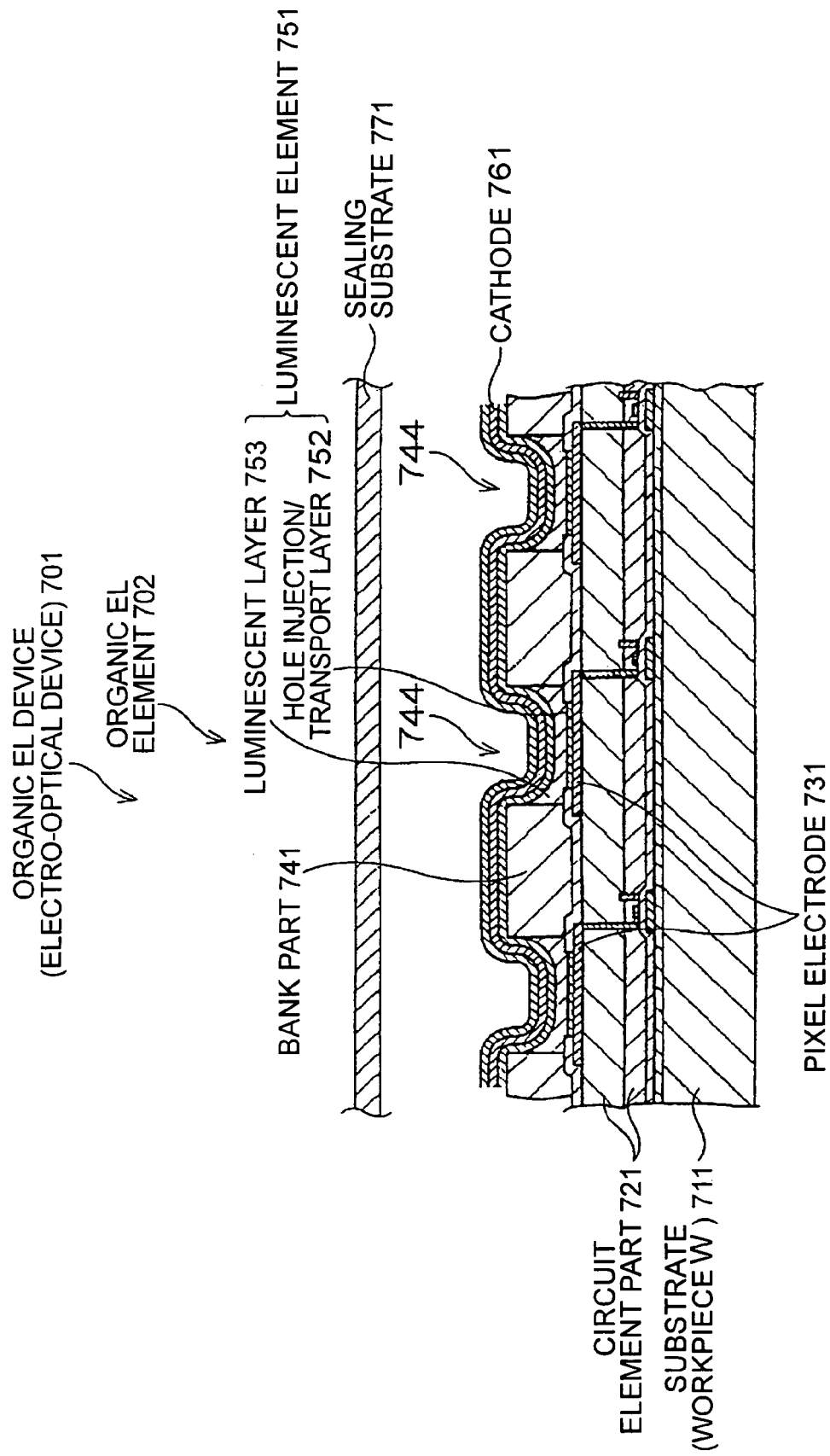
FIG. 11 is a sectional view illustrating a shape example of an organic EL device manufactured with a droplet discharge device according to the exemplary embodiment of the invention.

FIG. 11 illustrates a structural example of an organic EL device. The organic EL device that is a kind of flat panel displays is manufactured using the droplet discharge device according to the embodiment of the invention as a drawing device. An organic EL device 701 is constructed with an organic EL element 702 to which a wiring of a flexible substrate (not shown) and a drive IC (not shown) are connected. The organic EL element 702 includes a substrate 711, a circuit element part 721, pixel electrodes 731, bank parts 741, a luminescent element 751, a cathode 761 (counter electrode), and a sealing substrate 771.

The circuit element part 721 is formed on the substrate 711 of the organic EL element 702. A plurality of pixel electrodes 731 is arrayed on the circuit element part 721. The bank part 741 is formed in a grid like between pixel electrodes 731. The luminescent element 751 is formed at a concave-opening 744 formed with the bank part 741. The cathode 761 is formed on entire upper surfaces of the bank part 741 and the luminescent elements 751. The sealing substrate 771 is deposited on the cathode 761.

A manufacturing process of the organic EL display device 702 can include the following steps: a bank part forming step for forming the bank parts 741; a plasma treatment step for properly forming the luminescent elements 751; a luminescent element forming step for forming the luminescent elements 751; a counter electrode forming step for forming the cathode 761; and a sealing step for depositing the sealing substrate 771 on and sealing the cathode 761.

That is, the organic EL element 702 is manufactured by the following manner: the bank parts 741 are formed on a predetermined position of the substrate 711 (workpiece W) on which the circuit element part 721 and the pixel electrode 731 have been formed in advance; subsequently, a plasma treatment, forming of the luminescent element 751, and forming of the cathode 761 (counter electrode) are performed in this order; then, the sealing substrate 771 is deposited on and seals the cathode 761. Meanwhile, since the organic EL element 702 is easily deteriorated by influencing of moisture, etc., in an air atmosphere, manufacturing of the organic EL element 702 is preferably conducted in an atmosphere of dry air or inert gas such as nitrogen, argon, helium, etc.

Each luminescent element 751 is made up of a layered part including a hole injection/transport layer 752 and a luminescent layer 753 colored in any of red (R), green (G) and blue (B). The luminescent element forming step includes a hole injection/transport forming step for forming the hole injection/transport layers 752 and a luminescent layer forming step for forming the luminescent layers 753 of three colors.

After manufacturing the organic EL element 702, wirings of flexible substrate are connected to the cathode 761 of the organic EL element 702, and wirings of the circuit element part 721 are connected to the drive IC, whereby the organic EL device 701 is achieved.

Next, a case will be explained in which the droplet discharge device 10 according to the embodiment of the invention is applied to manufacturing liquid crystal display devices.

Figure 12:
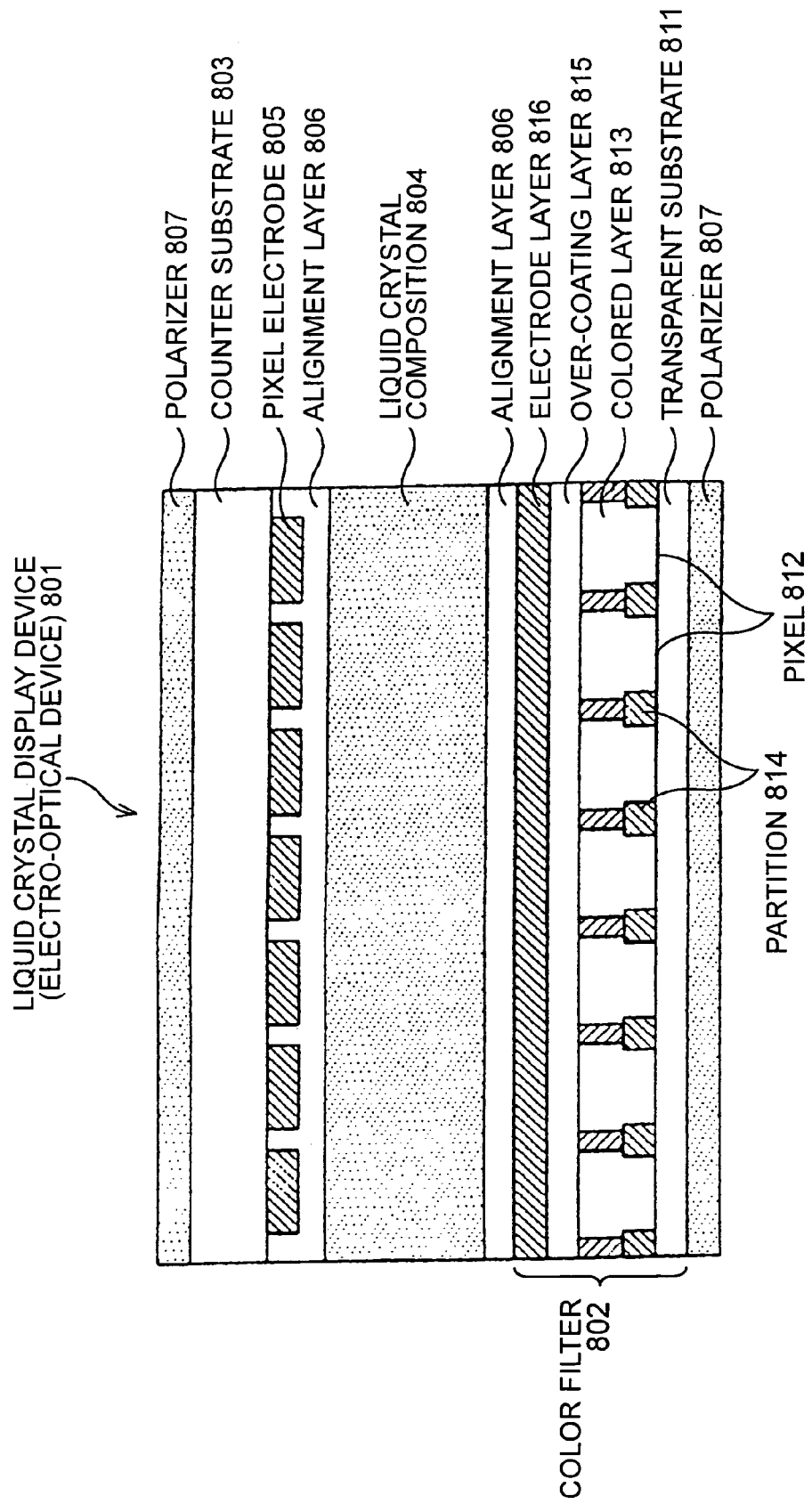
FIG. 12 is a sectional view illustrating a construction example of a liquid crystal display manufactured with a droplet discharge device according to the exemplary embodiment of the invention.

FIG. 12 illustrates a sectional construction of a liquid crystal display device 801. The liquid crystal display device 801 is constructed with a color filter 802, a counter substrate 803, a liquid crystal composition 804 sealed between the color filter 802 and the counter substrate 803, and a backlight (not shown). A pixel electrode 805 and a thin film transistor (TFT) element are formed in a matrix like on a surface of the counter substrate 803. The surface faces to the liquid crystal composition. A colored layer 813 of red, green, and blue of the color filter 802 are disposed at a position facing the pixel electrode 805. An alignment layer 806 is formed on a first surface of the color filter 802 and a first surface of the counter substrate 803. Both first surfaces are faced each other toward the liquid crystal composition. A polarizer 807 is adhesively bonded on a second surface of the color filter 802 and a second surface of the counter substrate 803. Each first surface is opposite to each second surface.

The color filter 802 can include a transparent substrate 811 having light transparency, a plurality of pixels (filter elements) 812 arrayed on the transparent substrate 811 in a matrix like, the colored layer 813 formed on the pixels 812, and a partition 814 having light-shading property to partition each pixel 812. An over-coating layer 815 and an electrode layer 816 are formed on the upper surfaces of the colored layer 813 and the partition 814.

A manufacturing method of the liquid crystal display device 801 will be described below. First, the partition 814 is fabricated to the transparent substrate 811. Then, the colored layer 813 of R (red), G (green), and B (blue) is formed to the pixel 812. Subsequently, the over-coating layer 815 is formed by spin coating transparent acrylic resin paint. Then, the electrode layer 816 made of indium tin oxide (ITO) is formed. As a result, the color filter 802 can be made.

The pixel electrode 805 and the TFT element are fabricated to the counter substrate 803. Subsequently, the alignment layer 806 is applied to the colored filter 802 and the counter substrate 803 on which the pixel electrode 805 has been formed. Then two are bonded together. Next, the liquid crystal composition 804 is sealed between the color filter 802 and the counter substrate 803. Then, the polarizer 807 and the backlight are stacked.

The exemplary embodiment of droplet discharge device according to the invention can be used for forming a filter element of the color filter (the colored layer 813 of R (red), G (green), and B (blue)). In addition, the exemplary embodiment can be used for forming the pixel electrode 805 using a liquid material corresponding to the pixel electrode 805.

Also, for other electro-optical device, various types of devices may be considered that includes metal wiring forming, lens forming, resist forming, light diffuser forming devices, etc., and preparation forming. Using the droplet discharge device makes it possible to efficiently manufacture various types of electro-optical devices.

Electronic equipment according to another exemplary embodiment of the invention includes the electro-optical device. In this case, as the electronic equipment, a cellular phone, a personal computer, and various electrical products, each mounting the so-called flat panel display, are relevant.

Figure 13:
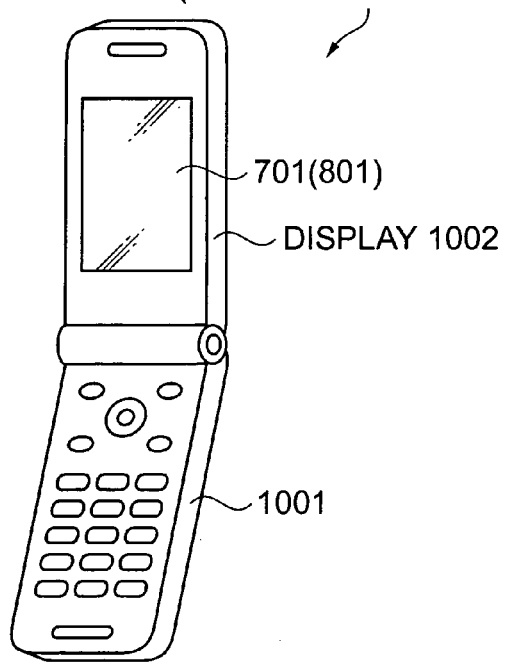
FIG. 13 is a perspective view illustrating a cellular phone that is one example of electronic equipment having a display manufactured by an exemplary embodiment of the invention.

FIG. 13 shows a shape example of a cellular phone 1000 that is an example of electronic equipment. The cellular phone 1000 can include a body 1001 and a display 1002. For the display 1002, for example, an organic EL device 701 or a liquid crystal display device 801, which are the electro-optical devices, are used.

Figure 14:
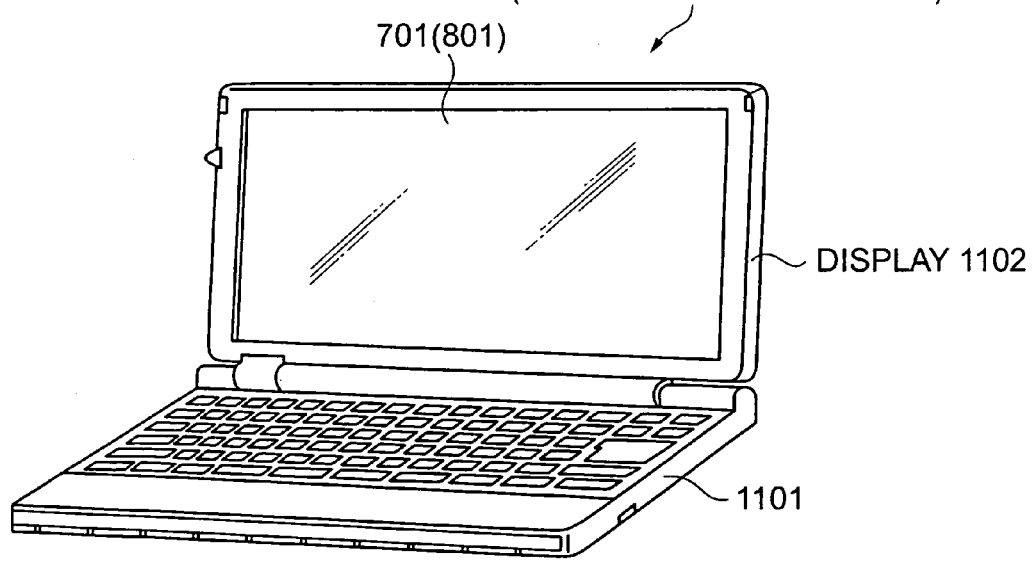
FIG. 14 is a perspective view illustrating a computer that is another example of electronic equipment.

FIG. 14 shows a computer 1100 that is another example of electronic equipment. The computer 1100 includes a body 1101 and a display 1102. For the display 1102, the organic EL device 701 and the liquid crystal display device 801, which are examples of the electro-optical devices, are used.

The droplet discharge device and the method of discharging a droplet according to the exemplary embodiment of the invention include a head for discharging minute droplet stably and accurately. In order to suppress a nozzle clogging of the head, a clogged nozzle is detected by so-called incomplete dot detection (detection of inactive discharge nozzle) before operating droplet discharge.

If the number of clogged nozzles exceeds a constant number of nozzles, the number of flushings (the number of droplet discharges) of droplets from the nozzle 81 to inside the cap 1751 is increased from an original number while the nozzle surface 70 being sealed with the cap 1751 as shown in FIG. 8. That is, for example, in FIG. 10, the discharge unit of the number of flushings in the cap is increased respectively in the following cases: the ratio N of inactive discharge nozzle is more than 5% in the mode 2; the ratio N of inactive discharge nozzle is more than 5% and 10% or below in the mode 3; and the N is more than 10% in the mode3. Also, the left-standing-time (capping-time) of the sealed condition in which the cap 1751 seals the nozzle surface 70 as shown in FIG. 8 is increased by increasing of the ratio N of inactive discharge nozzle.

Accordingly, a liquid is absorbed into the absorber 1752 inside the cap 1751, thereby increasing a humectant property in the cap 1751. Increasing of the humectant property in the cap 1751 keeps the nozzle surface 70 moist, whereby a clogging condition of the nozzle 81 that is clogged can surely be recovered.

If a related art method is used in which a nozzle clogging is recovered by only suction in cleaning operation, a lot of liquid is wastefully exhausted by repeated suction in cleaning operation conducted repeatedly until the clogging is eliminated.

However, in the embodiment of the invention, if the ratio N of inactive discharge nozzle exceeds a fixed value, the flushing is performed and the cap is left as shown in FIG. 8. As a result, an amount of disposed liquid can be grossly reduced as compared with a cleaning of repeated suction with the cap. Consequently, expensive discharge liquid can be utilized more effectively in manufacturing electro-optical devices, etc.

In the step ST10 in FIG. 9, users can perform the cleaning sequence as the step ST 11 shown in FIG. 9 based on the table A, not table B, shown in FIG. 10 after intentionally skipping the capping-time (left-standing-time) setting.

That is, users can freely select either to employ a nozzle clogging recovery method in which the flushing is conducted and the cap is left as shown in FIG. 8, or to recover a nozzle clogging using the cleaning sequence as shown in FIG. 6.

A user can select the following two operations by using the selecting device 700 shown in FIG. 5: the flushing is conducted and the cap is left; and the cleaning sequence shown in FIG. 6 is conducted to recover the clogging. This has the following merit. If a user intends to conduct a droplet discharge operation regardless of the ratio N of inactive discharge nozzle, the droplet discharge operation can have a priority to be conducted by selecting and performing the cleaning sequence CL without selecting the cap-left-standing condition.

The capping-time (left-standing-time) shown in FIG. 10 can automatically detect and recover nozzle clogging, and surely report a time at which discharge can be start again to users by taking a table into the sequence shown in FIG. 9 in advance. The table is constructed with the following items: the ratio N of inactive discharge nozzle (ratio of so-called incomplete nozzle); the nozzle line that includes an inactive nozzle shown in FIG. 4 and a liquid type corresponding to the nozzle; the capping-time (month); and the number of flushings.

In the aforementioned exemplary embodiments, examples are shown in which droplets are discharged to a workpiece of electro-optical device.

However, the droplet discharge device according to the embodiments of the invention can be used for not only this, but also the case in which, for example, a printing is conducted to a workpiece using a plurality types of liquids. A case will be explained in which the embodiment of the droplet discharge device according to the invention discharges a plurality types of liquids to a printing object as a workpiece or target, for example.

In a case where the number of inactive nozzles in head such as a head clogging, etc is a large number, there may be a case in which a nozzle clogging cannot be eliminated by performing a repeated cleaning sequence with conventional way. This is because that a liquid is solidified by increasing a viscosity of the liquid at an orifice of a nozzle, and the solidification is extended in a cavity of a head. In addition, for example, in a case where a head has a construction of four nozzle lines to discharge four color liquids, no problem occurs in suctioning each line with equal suction force, if four nozzles are suctioned simultaneously with one cap and cloggings of all colors are equally recovered. However, if only magenta (M) is not good in recovery among four colors, while each liquid is suctioned from the openings of nozzle of rest three colors: black (B), cyan (C), and yellow (Y), the liquid cannot be suctioned from the opening of nozzle corresponding to magenta. In order to recover the flogging at the nozzle orifice, nozzle lines of four colors are required to be cleaned simultaneously in many times.

Even in such case, using the embodiment of the invention, a method is effective in which humectant property is given in a cap and a head is left for the capping-time (left-standing-time).

In the exemplary embodiment of the invention, the cleaning sequence is not repeatedly required even though the ratio of inactive nozzle is increased. This makes it possible to reduce wastage of discharged liquid. As a result, an amount of expensive liquid to be used such as ink can be reduced. Thus, resources are saved.

An operation can be lessened in which a discharge defect of nozzle of head is tried to recover by repeated cleaning. The water-shedding quality on a nozzle surface of a head is prevented from being deteriorated. Wiping materials are prevented from being worn off. Life of suction pump can be lengthened.

Even though liquid types or ink colors are changed, recovery of clogging of nozzle can reliably be conducted and an amount of disposed liquid can be reduced.

It should be also understood that the invention is not limited to the above-mentioned embodiments, and that various changes can be made without departing from the spirit and scope of the invention set forth in the claims. In addition, the above-mentioned exemplary embodiments may be constructed by their mutual combination.

What is claimed is:

1. A droplet discharge device that discharges a droplet to a workpiece, comprising:
   a head including a plurality of nozzles capable of discharging droplets of a supplied liquid;
   a device capable of sealing and suctioning a surface of at least one of the plurality of nozzles of the head;
   a controller that controls a suction operation and a flushing operation such that during the suction operation, the device capable of sealing and suctioning seals and suctions the surface of the at least one nozzle, and during the flushing operation, the surface of the at least one nozzle is left sealed and the head discharges at least one droplet from the at least one nozzle such that the surface of the at least one nozzle is left moist, wherein the flushing operation is performed when a number of clogged nozzles exceeds a predetermined number; and
   a selecting device that selects at least one of the suction operation and the flushing operation.

2. The droplet discharge device according to claim 1, in a case where the number of clogged nozzles is the predetermined number or below, the controller letting the device seal and suction the surface of the nozzle of the head.

3. The droplet discharge device according to claim 1, further comprising:
   a left-standing-time reporting device that reports time in which the surface of the nozzle is kept moist by leaving the surface of the nozzle sealed.

4. The droplet discharge device according to claim 3, further comprising:

an inactive discharge nozzle detection part that detects the clogged nozzle and reports to the controller.

5. A method of discharging a droplet in which the droplet is discharged from a head to a workpiece, comprising:

sealing a surface of a nozzle by a device that is capable of sealing and suctioning the surface of the nozzle;

discharging the droplet from the nozzle to the device capable of sealing and suctioning;

controlling a suction operation and a flushing operation such that during the suction operation, the device capable of sealing and suctioning seals and suctions the surface of the nozzle, and during the flushing operation the surface of the nozzle is left sealed and the head discharges at least one droplet from the nozzle such that the surface of the nozzle is left moist, wherein the flushing operation is performed when a number of clogged nozzles exceeds a predetermined number; and selecting at least one of the suction operation and the flushing operation.

6. A method of manufacturing an electro-optical device that is manufactured by using a droplet discharge device that discharges a droplet from a head to a workpiece, the method comprising:

sealing a surface of a nozzle by a device that is capable of sealing and suctioning the surface of the nozzle;

discharging the droplet from the nozzle to the device capable of sealing and suctioning;

controlling a suction operation and a flushing operation such that during the suction operation, the device capable of sealing and suctioning seals and suctions the surface of the nozzle, and during the flushing operation the surface of the nozzle is left sealed and the head discharges at least one droplet from the nozzle such that the surface of the nozzle is left moist, wherein the flushing operation is performed when a number of clogged nozzles exceeds a predetermined number;

selecting at least one of the suction operation and the flushing operation; and discharging the droplet to the workpiece.

7. An electro-optical device manufactured by using the method according to claim 6.

8. Electronic equipment equipped with the electro-optical device according to claim 7.

* * * * *